US012776351B2

(12) United States Patent
Michioka

(10) Patent No.: US 12,776,351 B2
(45) Date of Patent: Oct. 27, 2026

(54) SEMICONDUCTOR MEMORY DEVICE AND CONTROL METHOD THEREOF

(71) Applicant: Winbond Electronics Corp., Taichung City (TW)

(72) Inventor: Yoshihisa Michioka, Yokohama (JP)

(73) Assignee: WINBOND ELECTRONICS CORP., Taichung City (TW)

(*) Notice: Subject to any disclaimer, the term of this patent is extended or adjusted under 35 U.S.C. 154(b) by 110 days.

(21) Appl. No.: 19/045,341

(22) Filed: Feb. 4, 2025

(65) Prior Publication Data

US 2025/0308565 A1 Oct. 2, 2025

(30) Foreign Application Priority Data

Mar. 27, 2024 (JP) ................................ 2024-050818

(51) Int. Cl.
*G11C 11/4099* (2006.01)
*G11C 7/10* (2006.01)

(52) U.S. Cl.
CPC .......... *G11C 7/1051* (2013.01); *G11C 7/1078* (2013.01); *G11C 2207/105* (2013.01); *G11C 2207/2254* (2013.01)

(58) Field of Classification Search
CPC .................................................. G11C 11/4099
See application file for complete search history.

(56) References Cited

U.S. PATENT DOCUMENTS

| | | | | |
|---|---|---|---|---|
| 11,101,802 | B2 | 8/2021 | Choi | |
| 11,127,462 | B2 | 9/2021 | Lee et al. | |
| 2022/0337457 | A1 | 10/2022 | Yamamoto et al. | |
| 2023/0147293 | A1* | 5/2023 | Cho | G11C 11/4099 365/189.09 |

FOREIGN PATENT DOCUMENTS

| | | | |
|---|---|---|---|
| CN | 108133724 | A | 6/2018 |
| CN | 107239092 | B | 8/2019 |
| JP | 2007-123987 | A | 5/2007 |
| TW | I734105 | B | 7/2021 |
| TW | 202401431 | A | 1/2024 |

* cited by examiner

*Primary Examiner* — Jason Lappas
(74) *Attorney, Agent, or Firm* — Birch, Stewart, Kolasch & Birch, LLP

(57) ABSTRACT

A semiconductor memory device and a control method thereof are provided. The semiconductor memory device includes a plurality of memory dies and a control unit. The memory dies are connected to a common external resistor through calibration pads. While executing pull-up calibration on the first memory die, the control unit is configured to execute pull-down calibration on at least one second memory die which is different from the first memory die. While executing pull-up calibration of the second memory die, the control unit is configured to execute pull-down calibration of the first memory die.

20 Claims, 7 Drawing Sheets

SEMICONDUCTOR MEMORY DEVICE AND CONTROL METHOD THEREOF

CROSS REFERENCE TO RELATED APPLICATIONS

This Application claims priority of Japan Patent Application No. 2024-050818, filed on Mar. 27, 2024, the entirety of which is incorporated by reference herein.

BACKGROUND OF THE INVENTION

Field of the Invention

The present invention relates to a semiconductor memory device and a control method thereof.

Description of the Related Art

In a conventional semiconductor memory device, impedance calibration such as ZQ calibration is performed in order to integrate the impedance of the transmission path and the output impedance of the output circuit. In addition, in order to reduce manufacturing costs, conventional semiconductor memory devices are configured so that a plurality of memory dies share ZQ terminals and external resistors (for example, patent document: Japanese Patent Application Publication No. 2007-123987).

When ZQ calibration is performed in a conventional semiconductor memory device, a pull-up calibration is first performed to optimize a pull-up code, and a pull-down calibration is performed using the pull-up code to optimize a pull-down code. The processing time of impedance calibration may increase as the number of memory dies increases when performing ZQ calibration in a semiconductor memory device in which the ZQ terminal and external resistor are shared by a plurality of memory dies. This is because the start timing of the impedance calibration needs to be changed between each of the memory dies, as shown in FIG. 1. For example, in FIG. 1, when the number of memory dies is set to N (N is an integer not less than 2), and the processing time of each pull-up calibration and pull-down calibration is t (t>0), then, the processing time of impedance calibration of the semiconductor memory device is expressed as (N+1)t.

In view of aforementioned problems, one object of the present invention is to provide a semiconductor memory device and a control method thereof, which can shorten the processing time of impedance calibration when a plurality of memory dies are connected to external resistors.

BRIEF SUMMARY OF THE INVENTION

The present invention provides a semiconductor memory device, which includes a plurality of memory dies and a control unit. The memory dies are connected to a common external resistor through calibration pads. The control unit is configured to execute pull-down calibration of at least one second memory die which is different from a first memory die in the plurality of memory dies during pull-up calibration of the first memory die of the plurality of memory dies, and to execute pull-down calibration of the first memory die in the plurality of memory dies during pull-up calibration of the second memory die in the plurality of memory dies.

The present invention provides a control method of a semiconductor memory device which includes a plurality of memory dies and a control unit; wherein the memory dies are connected to a common external resistor through calibration pads. The control unit of the semiconductor memory device is configured to execute the operations of: performing pull-down calibration of at least one second memory die which is different from the first memory die in the plurality of memory dies while performing pull-up calibration of the first memory die in the plurality of memory dies, and performing pull-down calibration on the first memory die while performing pull-up calibration of the second memory die of the plurality of memory dies.

According to the semiconductor memory device and its control method of the present invention, when a plurality of memory dies are connected to external resistors, the time for processing impedance calibration can be shortened.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
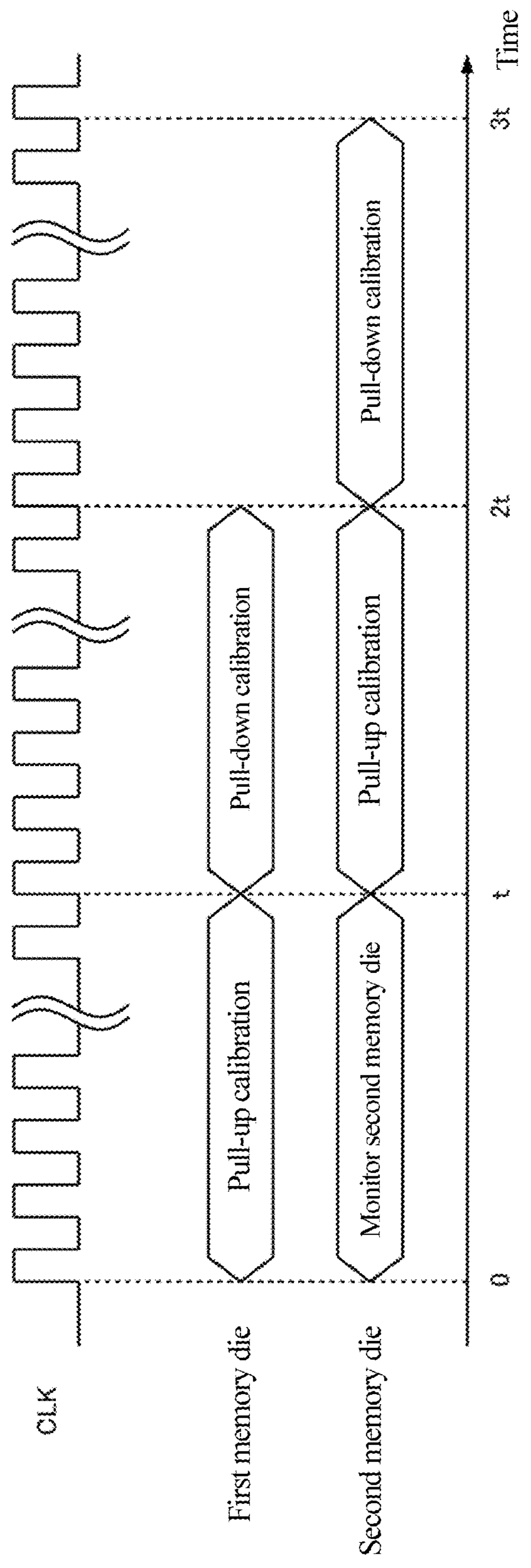
FIG. 1(Prior Art)
FIG. 1 illustrates an example of the sequence for processing impedance calibration in a conventional semiconductor memory device.
Figure 2:
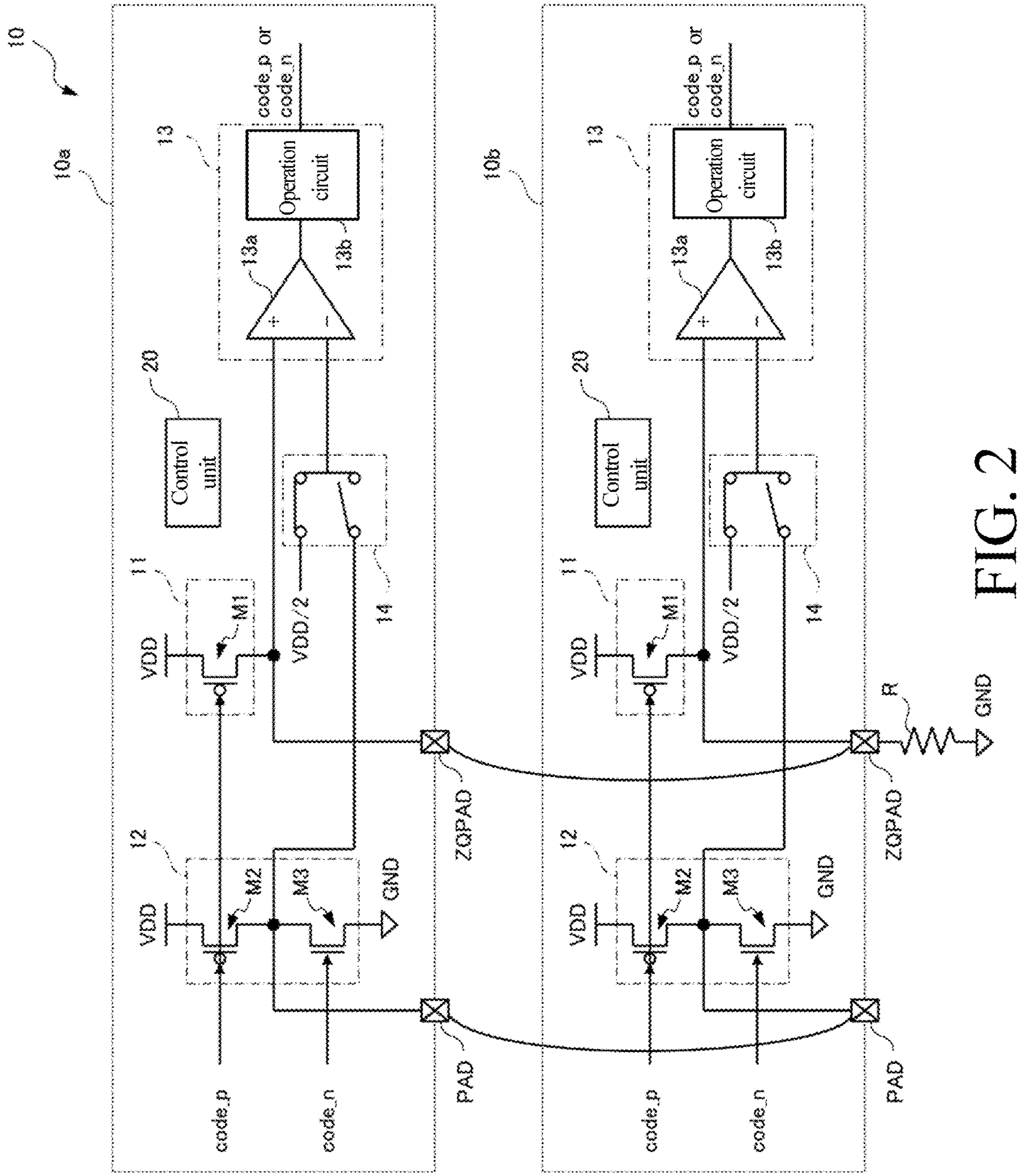
FIG. 2 illustrates a structural example of a semiconductor memory device according to one embodiment of the present invention.

FIG. 2 illustrates a structural example of a semiconductor memory device according to one embodiment of the present invention. As shown in FIG. 2, the semiconductor memory device includes a plurality of memory dies 10 (in the example of FIG. 2 having two memory dies), and each memory die 10 is provided with a control unit 20. On the calibration pad ZQPAD of each of the memory dies 10, an external resistor R common to the memory dies 10 is connected. The external resistor R has a resistance value that meets the requirements of the output circuit of the semiconductor memory device. In addition, each of the memory dies 10 is provided with other pads PAD that are different from the calibration pad ZQPAD, and the other pads PAD of each memory die 10 are connected to each other. In FIG. 2, two pads (the calibration pad ZQPAD and the other pad PAD) are provided on each memory die 10, for illustration. However, for example, three or more pads may be provided on each memory die 10. In FIG. 2, although it is shown that all the pads of each memory die 10 are connected to the pads of other memory die 10, at least one of all the pads of each memory die 10 may not be connected to the pads of the other memory dies 10.

In this embodiment, although the semiconductor memory device is DRAM (Dynamic Random Access Memory) as an example, the semiconductor memory device can be other semiconductor memory devices (for example, SRAM (Static Random Access Memory), flash memory, etc.).

In some embodiments, detailed descriptions of well-known circuits in semiconductor memory devices such as DRAM (for example, power supply circuits, command decoders, address decoders, clock generators, etc.) will be omitted for simplicity of explanation.

Each of the memory die 10 is equipped with a pull-up calibration unit 11, a pull-down calibration unit 12, a generating unit 13, a switch unit 14, and a control unit 20.

The pull-up calibration unit 11 is provided with a first transistor M1 and is configured to generate a first voltage based on a first control signal (pull-up code) code_p and the resistance value of the external resistor R. In this embodiment, although the first transistor M1 is a P-type field effect transistor (MOSFET, metal oxide semi-field effect transistor) as an example, the first transistor M1 may, for example, be an N-type MOSFET, or other transistors. In this case, the source terminal of the first transistor M1 (the first terminal of the first transistor) is connected to an operating voltage VDD, and the drain terminal of the first transistor M1 (the second terminal of the first transistor) is connected to the external resistor R through the calibration pad ZQPAD, and the first control signal code_p is input to the gate terminal (the control terminal of the first transistor).

The pull-down calibration unit 12 is provided with a second transistor M2 and a third transistor M3, and is configured to generate a second voltage based on the first control signal (pull-up code) code_p and a second control signal (pull-down code) code_n. In this embodiment, although the second transistor M2 is a P-type MOSFET and the third transistor M3 is an N-type MOSFET for illustration, the second transistor M2 can be, for example, an N-type MOSFET or other transistors. The third transistor M3 may be, for example, a P-type MOSFET or other transistors. In this case, the source terminal of the second transistor M2 (the first terminal of the second transistor) is connected to the operating voltage VDD, and the drain terminal of the second transistor M2 (the second terminal of the second transistor) is connected to the drain terminal of the third transistor M3 (the first terminal of the third transistor), and the first control signal code_p is input to the gate terminal of the second transistor M2 (the control terminal of the second transistor). In addition, the source terminal of the third transistor M3 (the second terminal of the third transistor) is connected to a ground voltage GND, and the gate terminal (the control terminal of the third transistor M3) is input with the second control signal code_n.

The pull-up calibration unit 11 and the pull-down calibration unit 12 have the same voltage versus current characteristics as the output circuit of the semiconductor memory device.

The first transistor M1 and the second transistor M2 provided on each of the memory dies 10 may have the same size (for example, the same channel width, and channel length, etc.). In short, the first transistor M1 and the second transistor M2 provided on each memory die 10 may have the same resistance characteristics.

The generating unit 13 includes a comparator 13*a*, and an operation circuit 13*b*, and is configured to generate the first control signal code_p based on a first comparison result obtained by comparing the first voltage and a reference voltage when performing pull-up calibration in the corresponding memory die; and to generate the second control signal code_n based on a second comparison result obtained by comparing the first voltage and the second voltage when performing pull-down calibration in the corresponding memory die.

One terminal ("+" terminal or non-inverting terminal) of the comparator 13 is connected to the drain terminal of the first transistor M1 (the second terminal of the first transistor). In addition, the other terminal ("−" terminal or inverting terminal) of the comparator 13 is connected to the switch unit 14.

The operation circuit 13*b* is connected to the output terminal of the comparator 13*a* and receives the comparison result of the comparator 13*a*. The operation circuit 13*b* is configured to generate the first control signal code_p or the second control signal code_n based on the received comparison result. The operation circuit 13*b* is configured to generate the first control signal code_p or the second control signal code_n according to the control of the control unit 20.

The switch unit 14 is provided with a first switch and second switch. The first switch is connected to the reference voltage, and the second switch is connected to a node to which the drain terminal of the second transistor M2 (the second terminal of the second transistor) and the drain terminal of the third transistor M3 (the first terminal of the third transistor) are connected. The switch unit 14 is further configured so that either the first switch or the second switch is turned on. For example, when the first switch is turned on, the reference voltage is input to the other terminal ("−" terminal) of the comparator 13*a*; when the second switch is turned on, the voltage at the drain terminal of the second transistor M2 (the second terminal of the second transistor) and the drain terminal of the third transistor M3 (the first terminal of the third transistor) is input to the other terminal of the comparator 13*a*. The turn-on/turn-off (ON/OFF) control of the first switch and the second switch can be determined by the control unit 20. In this embodiment, although the value of the reference voltage is half the voltage value of the operating voltage VDD as an example, the value of the reference voltage can be set to any value.

When performing pull-up calibration on the first memory die 10*a* among the plurality of the memory dies 10, the control unit 20 performs pull-down calibration on one or more second memory dies 10*b* (which is different from the first memory die 10*a*) among the plurality of the memory dies 10. When performing pull-up calibration on the second memory die 10*b*, the control unit 20 performs pull-down calibration on the first memory dies 10*a*. The control unit 20 is composed of a dedicated hardware device or a logic circuit.

When the control unit 20 performs pull-up calibration on the first memory die 10*a*, the control unit 20 performs pull-down calibration on the second memory die 10*b* using the first control signal code_p generated in the first memory die 10*a*, by controlling the operation of the pull-up calibration unit 11 of the first memory die 10*a* and the pull-down calibration unit 12 of the second memory die 10*b*.

When the control unit 20 performs pull-down calibration on the first memory die 10*a*, the control unit 20 performs pull-down calibration on the first memory die 10*a* using the first control signal code_p generated in the second memory die 10*b*, by controlling operations the pull-down calibration unit 12 of the first memory die 10*a* and the pull-up calibration unit 11 of the second memory die 10*b*.

When the control unit 20 performs pull-up calibration on the first memory die 10*a*, the control unit 20 can make the first transistor M1 of the first memory die 10*a* operate, and make the first transistor M1 of the second memory die 10*b* stop operating. Therefore, the current only flowing through the first transistor M1 of the first memory die 10*a* can be sent to the external resistor R through the calibration pad ZQPAD.

When the control unit 20 performs pull-up calibration on the first memory die 10*a*, the control unit 20 can make the third transistor M3 of the first memory die 10*a* stop operating, and make the second transistor M2 of the second memory die 10*b* stop operating. Therefore, the current flowing through the first transistor M1 and the second transistor M2 of the first memory die 10*a* can be sent to the third transistor M3 of the second memory die 10*b*.

When the control unit 20 performs pull-down calibration on the first memory die 10*a*, the control unit 20 can make the second transistor M2 of the first memory die 10*a* stop operating, and make the third transistor M3 of the second memory die 10*b* stop operating. Therefore, the current flowing through the second transistor M2 of the second memory die 10*b* can be sent to the third transistor M3 of the first memory die 10*a*.

The control unit 20 of each memory die 10 is configured to determine whether to perform pull-up calibration or pull-down calibration operation on its corresponding memory die 10 in a predetermined timing sequence, using information stored in an OTPROM (One Time Programmable ROM) such as a ROM (Read Only Memory) or a non-volatile memory device.

Figure 3:
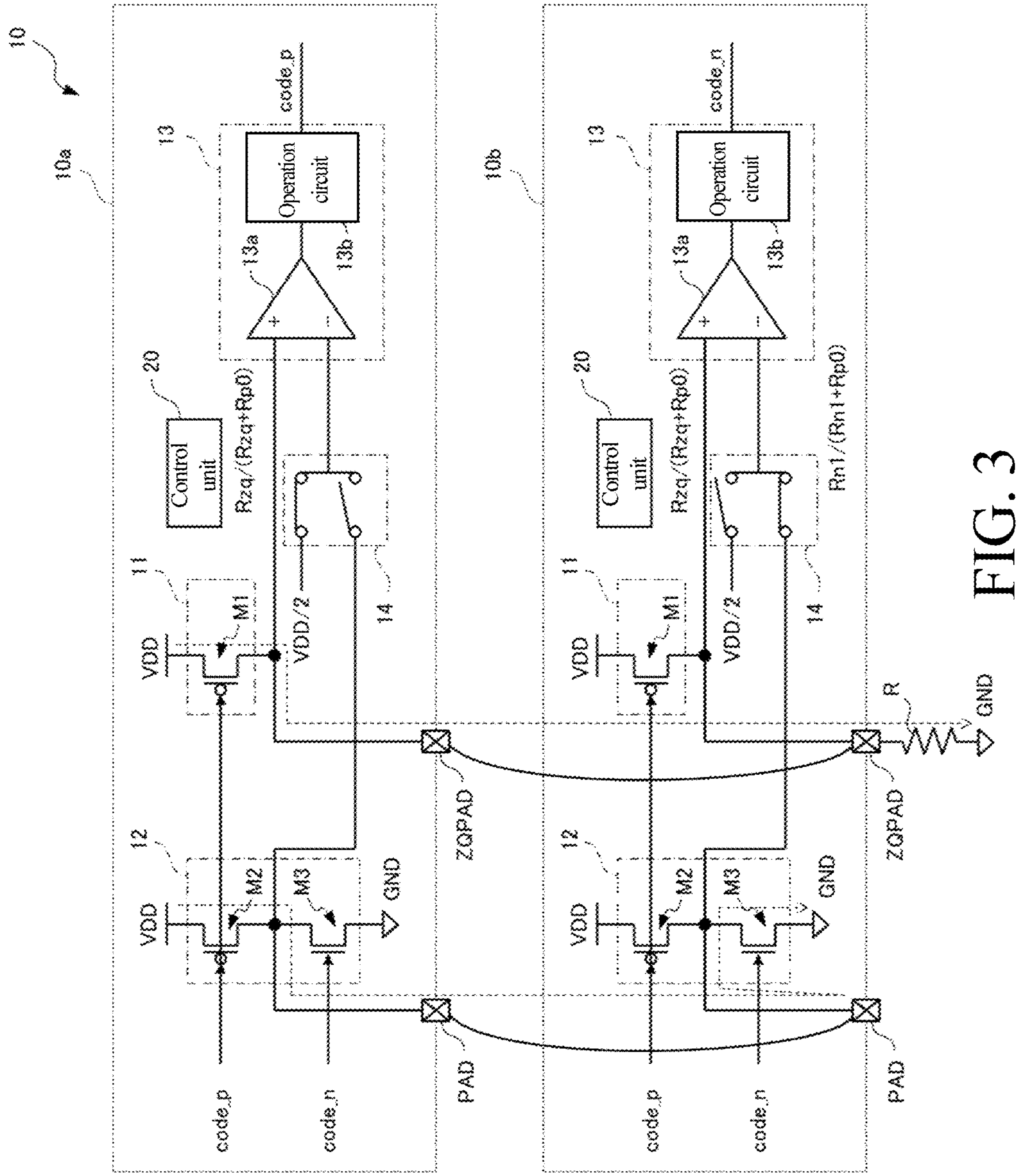
FIG. 3 illustrates an operation example of the semiconductor memory device when performing pull-up calibration on the first memory die.
Figure 4:
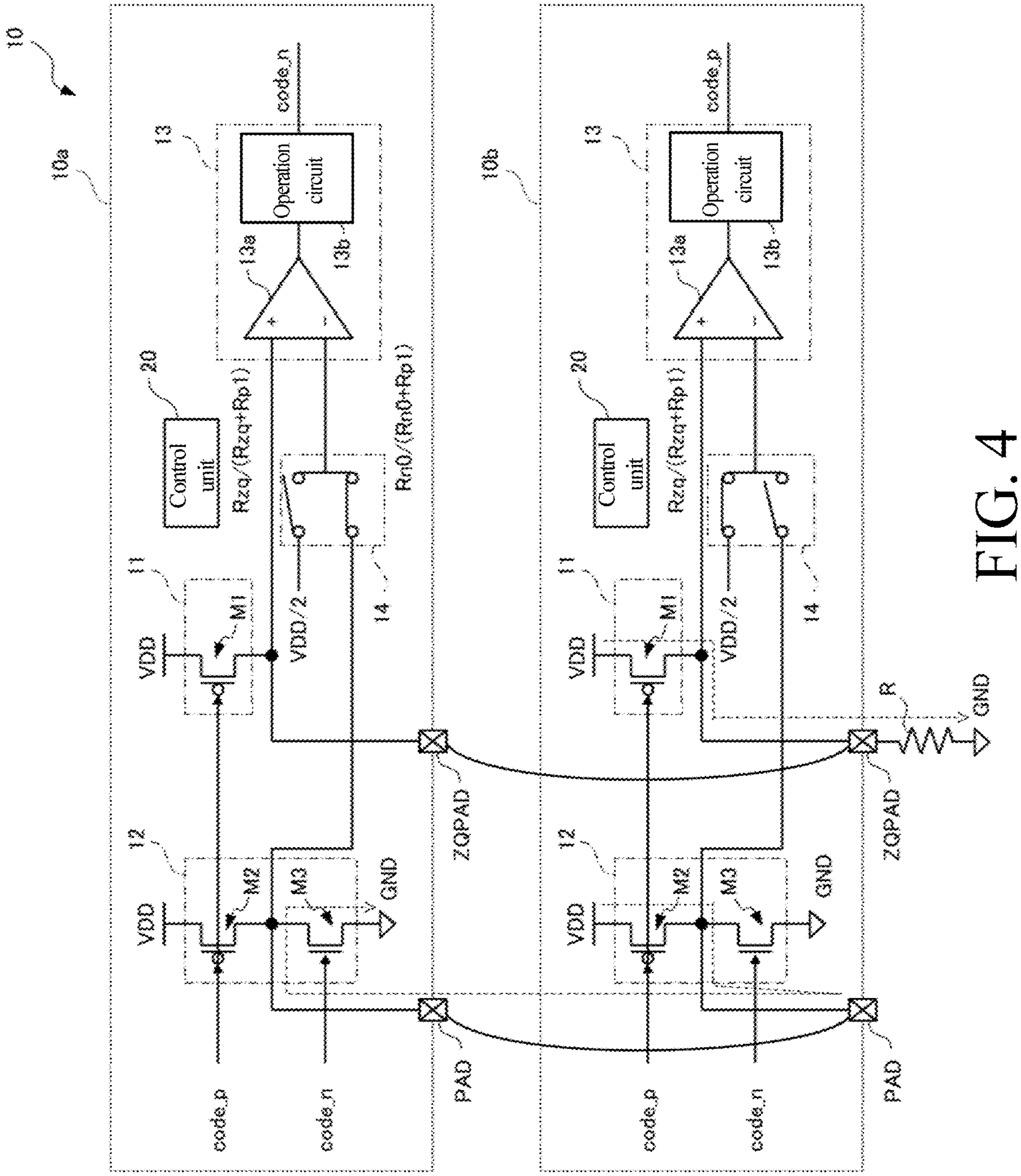
FIG. 4 illustrates an operation example of the semiconductor memory device when performing pull-down calibration on the first memory die.

Next, an example of the operation of the semiconductor memory device according to this embodiment will be described with reference to FIG. 3 and FIG. 4. FIG. 3 illustrates an operation example of the semiconductor memory device when performing pull-up calibration on the first memory die. FIG. 4 illustrates an operation example of the semiconductor memory device when performing pull-down calibration on the first memory die.

First, the situation in FIG. 3 is described. When the ZQ calibration command is input to the semiconductor memory device, the control unit 20 of the first memory die 10*a* performs pull-up calibration according to the clock signal CLK input from the outside or generated in the semiconductor memory device, and the control unit 20 of the second memory die 10*b* performs pull-down calibration on the second memory die 10*b*. The control unit 20 of the first memory die 10*a* stops the operation of the third transistor M3 of the first memory die 10*a*. At the same time, the control unit 20 of the second memory die 10*b* makes the first transistor M1 and the second transistor M2 of the second memory die 10*b* stop operating.

In this case, the current flowing in the first transistor M1 of the first memory die 10*a*, via the calibration pad ZQPAD of the first memory die 10*a*, flows to the external resistor R, as shown by the dotted arrow in FIG. 3. The current flowing in the second transistor M2 of the first memory die 10*a*, via each of the other calibration pads PAD of the first memory die 10*a* and the second memory die 10*b*, flows to the third transistor M3 of the second memory die 10*b*. In this case, the control unit 20 of the first memory die 10*a* controls the switch (not shown) which is connected to the third transistor M3 of the first memory die 10*a* to be turned off, and the control unit 20 of the second memory die 10*b* controls the switch (not shown) which is connected to the first transistor M1 and the second transistor M2 of the second memory die 10*b* to be turned off, thereby stopping the operation of these transistors by interrupting conduction of these transistors.

The control unit 20 of the first memory die 10*a* controls the first switch of the switch unit 14 of the first memory die 10*a* to be turned on. Therefore, the reference voltage is input to the other terminal ("−" terminal) of the comparator 13*a* of the generating unit 13 of the first memory die 10*a* (here, the value of the reference voltage is set to VDD/2). In addition, the control unit 20 of the second memory die 10*b* may control the second switch of the switch unit 14 of the second memory die 10*b* to be turned on. Therefore, the voltage (the second voltage) at the node to which the drain terminal of the second transistor M2 (the second terminal of the second transistor) and the drain terminal of the third transistor M3 (the second terminal of the second transistor) of the second memory die 10*b* are connected, is input to the other terminal of the comparator 13*a* of the generating unit 13.

In addition, the first voltage generated by the pull-up calibration unit 11 of the first memory die 10*a* is input to one terminal ("+" terminal) of the comparator 13*a* of the generating unit 13 of the first memory die 10*a*. When the resistance value of the external resistor R is set to Rzq and the resistance value of the first transistor M1 is set to Rp0, the value of the first voltage is expressed as Rzq/(Rzq+Rp0). Furthermore, the comparator 13*a* of the generating unit 13 of the first memory die 10*a* compares the first voltage with the reference voltage to generate a comparison result. When receiving the comparison result, the operation circuit 13*b* of the generating unit 13 of the first memory die 10*a* performs, for example, a binary search method based on the comparison result to generate the first control signal code_p; wherein, the first control signal code_p is used to adjust the first voltage (that is, adjust the resistance value of the first transistor M1 of the first memory die 10*a*), so that the voltage value on the calibration pad ZQPAD is equal to the reference voltage. The generated first control signal code_p is input to the first transistor M1 and the second transistor M2 of the first memory die 10*a*. In this way, pull-up calibration is performed in the first memory die 10*a*.

On the other hand, the first voltage (the value of the first voltage is expressed as Rzq/(Rzq+Rp0) here) is input to one terminal ("+" terminal) of the comparator 13*a* of the generating unit 13 of the second memory die 10*b*. The second voltage generated by the pull-down calibration unit 12 of the second memory die 10*b* is input to the other terminal ("−" terminal) of the comparator 13*a* of the generating unit 13 of the second memory die 10*b*. Here, for example, when the resistance value of the second transistor M2 of the first memory die 10*a* is set to Rp0, and the resistance value of the third transistor M3 of the second memory die 10*b* is set to Rn1, the value of the second voltage is expressed as Rn1/(Rn1+Rp0). The comparator 13*a* of the generating unit 13 of the second memory die 10*b* compares the first voltage and the second voltage and generates a comparison result. Here, when assumed that the resistance values of the first transistor M1 and the second transistor M2 of the first memory die 10*a* are equal (=Rp0), the comparator 13*a* compares the resistance Rzq of the external resistor R with the resistance value Rn1 of the third transistor M3.

When receiving the comparison result, the operation circuit 13*b* of the generating unit 13 of the second memory die 10*b* performs, for example, a binary search method based on the comparison result to generate a second control signal code_n; wherein the second control signal code_n is used to adjust the second voltage (that is, adjusting the resistance value of the third transistor M3 of the second memory die 10*b*) so that the first voltage and the second voltage are equal. The generated second control signal code_n is input to the third transistor M3 of the second memory die 10*b*. Here, when considering that the resistance value of the second transistor M2 of the first memory die 10*a* is controlled by the first control signal code_p generated by the first memory die 10*a*, then the first control signal code_p generated by the first memory die 10*a* is used in the second memory die 10*b* to perform pull-down calibration.

In this way, while the pull-up calibration is performed in the first memory die 10*a*, the pull-down calibration is performed in the second memory die 10*b* using the first control signal code_p generated in the first memory die 10*a*.

Next, the situation in FIG. 4 is described. When completing pull-up calibration on the first memory die 10*a* and pull-down calibration on the second memory die 10*b*, the control unit 20 of the first memory die 10*a* performs pull-down calibration on the first memory die 10*a*, and the control unit 20 of the second memory die 10*b* performs pull-up calibration on the second memory die 10*b*. The control unit 20 of the first memory die 10*a* stops operation of the first transistor M1 and the second transistor M2 of the first memory die 10*a*, and the control unit 20 of the second memory die 10*b* stops operation of the third transistor M3 of the memory die 10*b*.

In this case, the current flowing through the first transistor M1 of the second memory die 10*b* flows to the external resistor R through the calibration pad ZQPAD of the second memory die 10*b*, as shown by the dotted arrow in FIG. 4. The current flowing through the second transistor M2 of the second memory die 10*b* flows to the third transistor M3 of the first memory die 10 through the other pad PAD of the second memory die 10*b*, as indicated by the dotted arrows in FIG. 4.

The control unit 20 of the second memory die 10*b* controls the first switch of the switch unit 14 of the second memory die 10*b* to be turned on. Therefore, the reference voltage (the value of the reference voltage is expressed as VDD/2 here) is input to the other terminal ("−" terminal) of the comparator 13*a* of the generating unit 13 of the second memory die 10*b*. In addition, the control unit 20 of the first memory die 10*a* controls the second switch of the switch unit 14 of the first memory die 10*a* to be turned on. Therefore, the other terminal ("−" terminal) of the comparator 13*a* of the generating unit 13 of the first memory die 10*a* is input by the voltage (the second voltage) at the node between the drain terminal (the second terminal) of the second transistor M2 of the first memory die 10*a*, and the drain terminal (the first terminal) of the third transistor M3 of the first memory die 10*a*.

The first voltage generated by the pull-up calibration unit 11 of the second memory die 10*b* is input to the other terminal of the comparator 13*a* of the generation unit 13 of the second memory die 10*b*. Here, for example, when the resistance value of the external resistor R is set to Rzq and the resistance value of the first transistor M1 is set to Rp1, the value of the first voltage is expressed as Rzq/(Rzq+Rp1). Furthermore, the comparator 13*a* of the generating unit 13 of the second memory die 10*b* compares the first voltage with the reference voltage to generate a comparison result. In addition, when receiving the comparison result, the operation circuit 13*b* of the generation unit 13 of the second memory die 10*b* performs, for example, a binary search method based on the comparison result to generate the first control signal code_p; wherein, the first control signal code_p is used to adjust the first voltage (that is, adjusting the resistance value of the first transistor M1 of the second memory die 10*b*), so that the voltage value on the calibration pad ZQPAD is equal to the reference voltage. The generated first control signal code_p is input to the first transistor M1 and the second transistor M2 of the second memory die 10*b*. In this way, pull-up calibration is performed on the second memory die 10*b*.

On the other hand, the first voltage (here, the value of the first voltage is expressed as Rzq/(Rzq+Rp1) is input to one terminal of the comparator 13*a* of the generating unit 13 of the first memory die 10*a*. The second voltage generated by the pull-down calibration unit 12 of the first memory die 10*a* is input to the other terminal of the comparator 13*a* of the generating unit 13 of the first memory die 10*a*. Here, for example, when the resistance value of the second transistor M2 of the second memory die 10*b* is set to Rp1, and the resistance value of the third transistor M3 of the first memory die 10*a* is set to Rn0, the value of the second voltage is expressed as Rn0/(Rn0+Rp1). In addition, the comparator 13*a* of the generating unit 13 of the first memory die 10*a* compares the first voltage and the second voltage, and generates a comparison result.

When receiving the comparison result, the operation circuit 13*b* of the generating unit 13 of the first memory die 10*a* performs, for example, a binary search method based on the comparison result to generate the second control signal code_n; wherein, the second control signal code_n is used to adjust the second voltage (that is, adjusting the resistance value of the third transistor M3 of the first memory die 10*a*) to make the first voltage and the second voltage equal. The generated second control signal code_n is input to the third transistor M3 of the first memory die 10*a*. Here, when considering that the resistance value of the second transistor M2 of the second memory die 10*b* is determined by the first control signal code_p generated by the second memory die 10*b*, in the first memory die 10*a*, the first control signal code_p generated by the second memory die 10*b* is used to perform pull-down calibration.

In this way, while performing pull-up calibration in the second memory die 10*b*, pull-down calibration is performed in the first memory die 10*a* using the first control signal code_p generated by the second memory die 10*b*.

Figure 5:
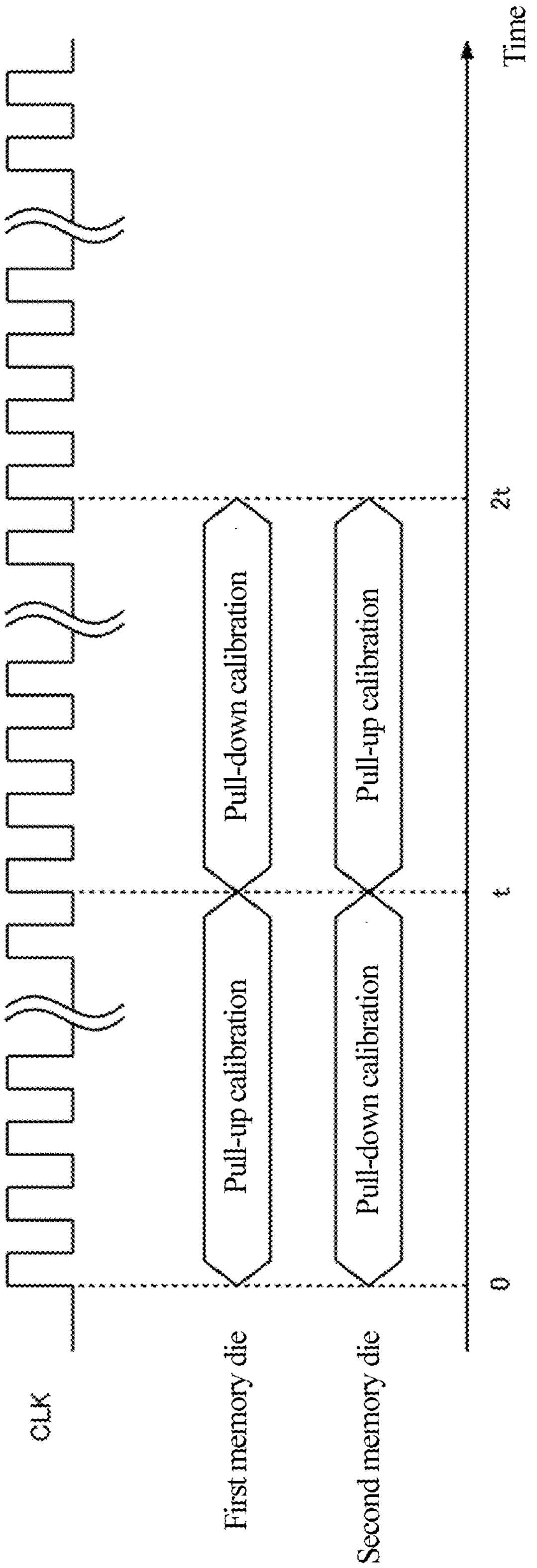
FIG. 5 illustrates an example of the sequence for processing the impedance calibration in the semiconductor memory device according to another embodiment.

As described above, by performing pull-down calibration on the second memory die 10*b* during the pull-up calibration of the first memory die 10*a*, and performing pull-up calibration on the second memory die 10*b* during the pull-down calibration of the first memory die 10*a*, as shown in FIG. 5, the processing time of the impedance calibration in the semiconductor memory device can be shortened to 2 t.

As described above, according to the semiconductor memory device and its control method of this embodiment, pull-up calibration in the first memory die 10*a* and pull-down calibration in the second memory die 10*b* can be performed simultaneously, and pull-down calibration in the first memory die 10*a* and the pull-up calibration in the second memory die 10*b* can be performed simultaneously. Therefore, compared with the case where the start timing of the impedance calibration is changed between each memory die for example, the processing time for impedance calibration in the semiconductor memory device can be shortened.

The aforementioned embodiments are illustrated to facilitate understanding of the present invention and are not intended to limit the present invention. However, each element disclosed in the above embodiments includes all design changes and equivalents within the technical scope of the present invention.

For example, in the above embodiments, although the number of the second memory die 10*b* is one, the present invention is not limited thereto. For example, the number of second memory dies 10*b* may be two or more. In this case, pull-down calibration can be performed on each of the plurality of second memory dies 10*b* during performing pull-up calibration on the first memory die 10*a*. Furthermore, and pull-down calibration can be performed on the first memory die 10*a* during the pull-up calibration of each second memory die 10*b*. It should be noted that in this case, the resistance characteristics of the respective transistors M1, M2, and M3 of each of the plurality of second memory dies 10*b* can be configured to be equal among the plurality of second memory dies 10*b*. In this case, the processing time of impedance calibration in the semiconductor memory device can be shortened as per the aforementioned embodiment.

In addition, when a set of memory dies sharing an external resistor R is provided for each different external resistor R, the control unit 20 may control to perform pull-down calibration on each second memory die 10*b* in the set of memory dies during the pull-up calibration of each first memory die 10*a* in the set of memory dies, and control to perform pull-down calibration on each first memory die 10*a* in the set of memory dies during the pull-up calibration of each second memory die 10*b* in the set of memory dies.

Figure 6:
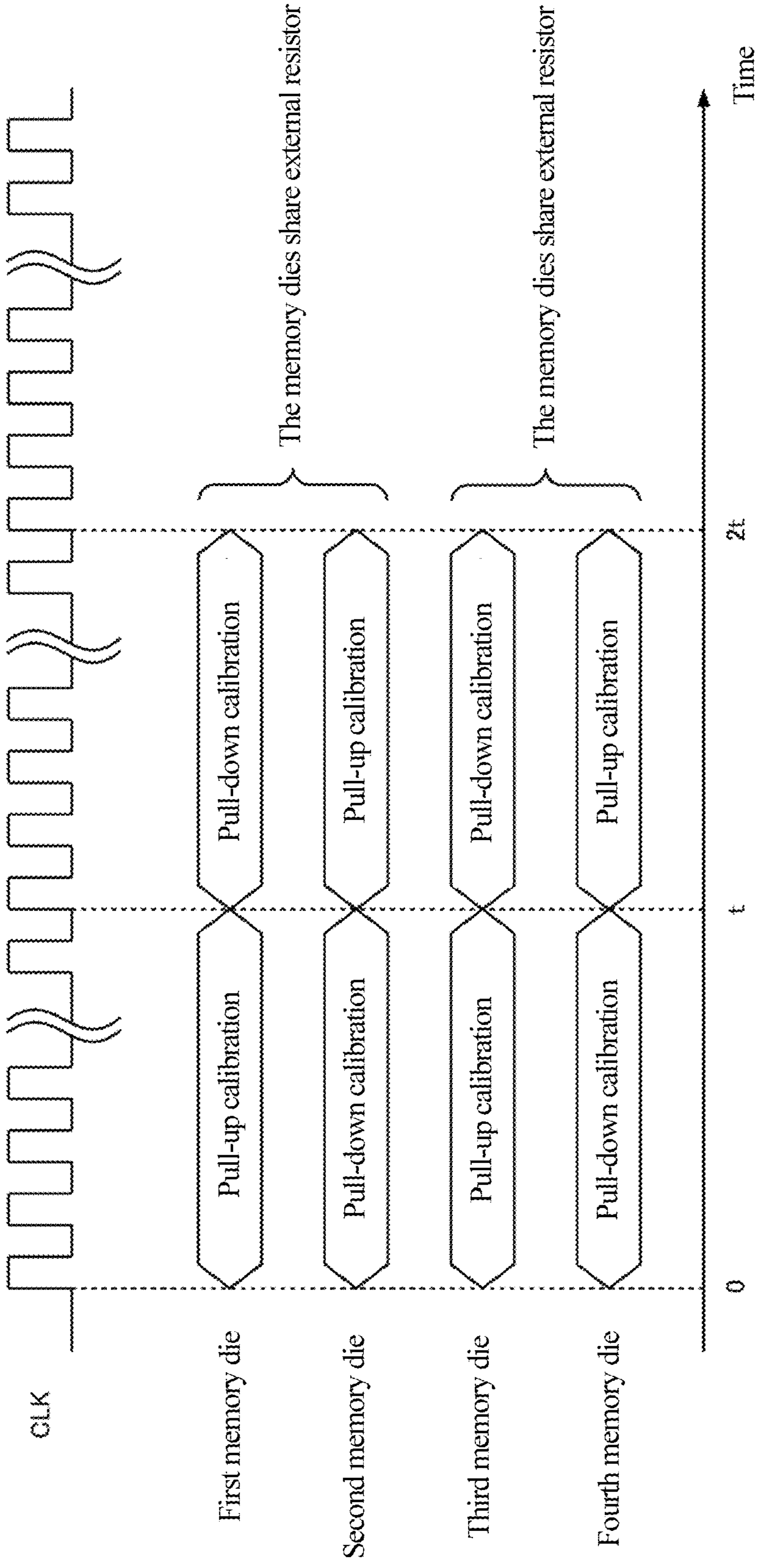
FIG. 6 illustrates a variation example of the procedure of the impedance calibration process in the semiconductor memory device according to a variation example.

As shown in FIG. 6, when the first memory die and the second memory die share a first external resistor, and the third memory die and the fourth memory die share a second external resistor, the control units 20 of the second and fourth memory dies perform pull-down calibrations on the corresponding memory dies (that is, the second and fourth memory dies) during the period that the control units 20 of the first and third memory dies perform pull-up calibrations on the corresponding memory dies (that is, the first and third memory dies), and further, the control units 20 of the first and third memory dies perform pull-down calibrations on the corresponding memory dies (that is, the first and third memory dies) during the period that the control units 20 of the second and fourth memory dies perform pull-up calibrations on the corresponding memory dies (that is, the second and fourth memory dies). In this case, similarly to the aforementioned embodiment, the processing time of impedance calibration in the semiconductor memory device can be shortened. In addition, the number of memory dies constituting the set of memory dies may be three or more.

Furthermore, the control unit 20 may be configured to perform pull-down calibration on the (i+1)-th memory die during the pull-up calibration on the i-th memory die (i is an integer from 1 to N−2) among N memory dies (N is an integer not less than 3), and to perform pull-down calibration on the (i+2)-th memory die during the pull-up calibration on the (i+1)-th memory die, and further to perform pull-down calibration on the first memory die during the pull-up calibration on the N-th memory die.

Figure 7:
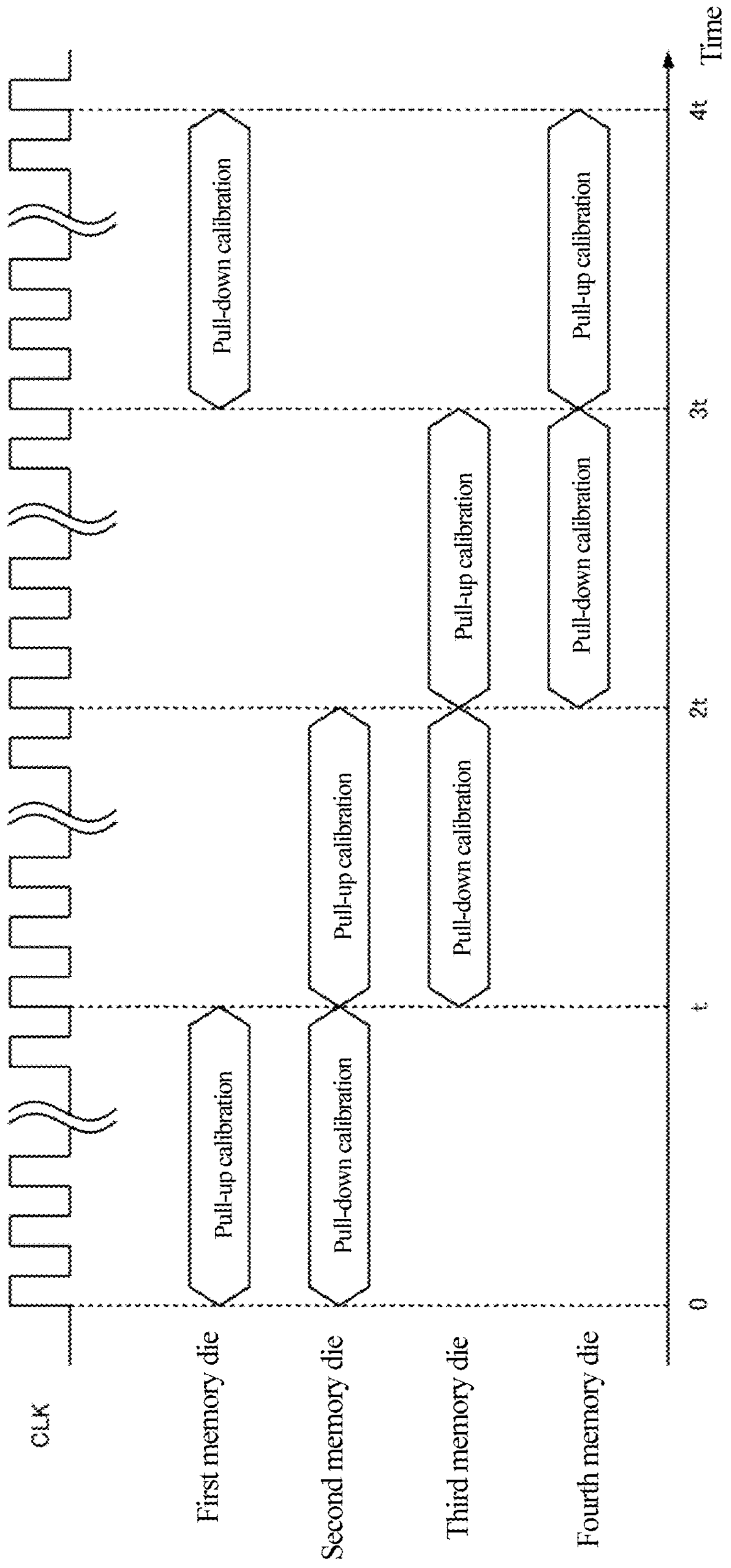
FIG. 7 illustrates another example of the sequence for processing the impedance calibration in the semiconductor memory device according to the variation example.

As shown in FIG. 7, when N is equal to 4, the control unit 20 of the second memory die performs pull-down calibration on the second memory die while the control unit 20 of the first memory die performs pull-up calibration on the first memory die. The control unit 20 of the third memory die performs pull-down calibration on the third memory die while the control unit 20 of the second memory die performs pull-up calibration on the second memory die. The control unit 20 of the fourth memory die performs pull-down calibration on the fourth memory die while the control unit 20 of the third memory die performs pull-up calibration on the third memory die. The control unit 20 of the first memory die performs pull-down calibration on the first memory die while the control unit 20 of the fourth memory die performs pull-up calibration on the fourth memory die. In this case, the processing time of impedance calibration in the semiconductor device can be shortened similarly to the embodiments described above.

In addition, in the aforementioned embodiments, although the control unit 20 is provided in each memory die 10 as an example, the present invention is not limited thereto. For example, a single control unit 20 may be provided to control whether to perform pull-up calibration or pull-down calibration in each memory die 10.

It should be noted that the configurations of the aforementioned embodiments are examples, so they can be appropriately changed, and other various configurations can also be adopted.

What is claimed is:

1. A semiconductor memory device, comprising:

a plurality of memory dies, connected to a common external resistor through calibration pads;

a control unit, configured to execute pull-down calibration of at least one second memory die which is different from a first memory die in the plurality of memory dies during pull-up calibration of the first memory die in the plurality of memory dies, and to execute pull-down calibration of the first memory die in the plurality of memory dies during pull-up calibration of the second memory die in the plurality of memory dies.

2. The semiconductor memory device as claimed in claim 1, wherein each of the plurality of memory dies includes:

a pull-up calibration unit, configured to generate a first voltage according to a first control signal and a resistance of the external resistor;

a pull-down calibrating unit, configured to generate a second voltage according to the first control signal and a second control signal; and a generating unit, configured to generate the first control signal according to a first comparison result obtained by comparing the first voltage with a reference voltage when pull-up calibration is performed, and generate the second control signal according to a second comparison result obtained by comparing the first voltage with the second voltage when pull-down calibration is performed.

3. The semiconductor memory device as claimed in claim 2, wherein when performing pull-up calibration on the first memory die, the control unit controls the pull-up calibration unit of the first memory die and the pull-down calibration unit of the second memory die to operate, such that the first control signal generated in the first memory die is used to perform pull-down calibration on the second memory die.

4. The semiconductor memory device as claimed in claim 2, wherein when performing pull-down calibration on the first memory die, the control unit controls the pull-down calibration unit of the first memory die and the pull-up calibration unit of the second memory die to operate, such that the first control signal generated in the second memory die is used to perform pull-down calibration on the first memory die.

5. The semiconductor memory device as claimed in claim 2, wherein the pull-up calibration unit includes: a first transistor which has a first terminal connected to an operating voltage, a second terminal connected to the calibration pad, and a control terminal receiving the first control signal; and wherein the first transistor adjusts a resistance value based on the first control signal.

6. The semiconductor memory device as claimed in claim 5, wherein when performing pull-up calibration on the first memory die, the control unit makes the first transistor of the first memory die operate and makes the first transistor of the second memory die stop operating.

7. The semiconductor memory device as claimed in claim 5, wherein the first transistor is a P-type transistor.

8. The semiconductor memory device as claimed in claim 2, wherein the pull-down calibration unit includes:

a second transistor, having a first terminal connected to an operating voltage, and a control terminal receiving the first input control signal; wherein the second transistor adjusts a resistance value based on the first control signal; and a third transistor, having a first terminal connected to a ground voltage, a second terminal connected to a second terminal of the second transistor, and a control terminal receiving the second control signal; wherein the third transistor adjusts a resistance value based on the second control signal.

9. The semiconductor memory device as claimed in claim 8, wherein when performing pull-up calibration on the first memory die, the control unit makes the third transistor of the first memory die stop operating and makes the second transistor of the second memory die stop operating.

10. The semiconductor memory device as claimed in claim 8, wherein when performing pull-down calibration on the first memory die, the control unit makes the second transistor of the first memory die stop operating and makes the third transistor of the second memory die stop operating.

11. The semiconductor memory device as claimed in claim 8, wherein the second terminal of the second transistor is connected to other pad that is different from the calibration pad.

12. The semiconductor memory device as claimed in claim 8, wherein the second transistor is a P-type transistor.

13. The semiconductor memory device as claimed in claim 8, wherein the third transistor is an N-type transistor.

14. The semiconductor memory device as claimed in claim 2, wherein the reference voltage is a half of an operating voltage.

15. The semiconductor memory device as claimed in claim 1, wherein when a set of memory dies sharing an external resistor is provided for each different external resistor, the control unit performs pull-down calibration on each of the second memory dies in the set of memory dies during the period of performing pull-up calibration on each of the first memory dies in the set of memory dies, and performs pull-down calibration on each of the first memory dies in the set of memory dies during the period of performing pull-up calibration on each of the second memory dies in the set of memory dies.

16. The semiconductor memory device as claimed in claim 1, wherein the control unit performs pull-down calibration on a i+1-th memory die of N memory dies during the period of performing pull-up calibration on an i-th memory die of the N memory dies, and performs pull-down calibration on a i+2-th memory die of N memory dies during the period of performing pull-up calibration on an i+1-th memory die of the N memory dies, and performs pull-down calibration on a first memory die of the N memory dies during the period of performing pull-up calibration on an N-th memory die of the N memory dies;

wherein i is an integer from 1 to N−2, and N is an integer not less than 3.

17. A control method of a semiconductor memory device, wherein the semiconductor memory device includes a plurality of memory dies which are connected to a common external resistor through calibration pads; wherein while executing pull-up calibration of a first memory die in the plurality of memory dies, a control unit of the semiconductor memory device executes pull-down calibration of at least one second memory die which is different from the first memory die in the plurality of memory dies, and while executing pull-up calibration of the second memory die in the plurality of memory dies, the control unit of the semiconductor memory device executes pull-down calibration of the first memory die in the plurality of memory dies.

18. The control method as claimed in claim 17, wherein each of the plurality of memory dies includes a pull-up calibration unit, a pull-down calibrating unit, and a generating unit; and wherein the control method further comprises:

by the pull-up calibration unit, generating a first voltage according to a first control signal and a resistance of the external resistor;

by the pull-down calibrating unit, generating a second voltage according to the first control signal and a second control signal; and by the generating unit, generating the first control signal according to a first comparison result obtained by comparing the first voltage with a reference voltage when pull-up calibration is performed, and generating the second control signal according to a second comparison result obtained by comparing the first voltage with the second voltage when pull-down calibration is performed.

19. The control method as claimed in claim 18, wherein when performing pull-up calibration on the first memory die, the control unit controls the pull-up calibration unit of the first memory die and the pull-down calibration unit of the second memory die to operate, such that the first control signal generated in the first memory die is used to perform pull-down calibration on the second memory die.

20. The control method as claimed in claim 18, wherein when performing pull-down calibration on the first memory die, the control unit controls the pull-down calibration unit of the first memory die and the pull-up calibration unit of the second memory die to operate, such that the first control signal generated in the second memory die is used to perform pull-down calibration on the first memory die.

* * * * *